(12) United States Patent
Koike

(10) Patent No.: US 6,207,965 B1
(45) Date of Patent: Mar. 27, 2001

(54) APPARATUS AND METHOD FOR ELECTRON BEAM LITHOGRAPHY AND SEMICONDUCTOR DEVICE

(75) Inventor: Kaoru Koike, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/193,228

(22) Filed: Nov. 17, 1998

(30) Foreign Application Priority Data

Nov. 18, 1997 (JP) .................................................. 9-317474

(51) Int. Cl.$^7$ .................................................. H01J 37/304
(52) U.S. Cl. ........................ 250/492.23; 250/397
(58) Field of Search .................. 250/492.2, 492.23, 250/492.22, 398, 491.1, 397

(56) References Cited

U.S. PATENT DOCUMENTS

| | | | |
|---|---|---|---|
| 4,647,782 | * 3/1987 | Wada et al. | 250/398 |
| 4,950,910 | * 8/1990 | Yasuda et al. | 250/398 |
| 5,557,314 | * 9/1996 | Okamoto et al. | 346/112 |
| 5,757,409 | * 5/1998 | Okamoto et al. | 347/230 |

* cited by examiner

*Primary Examiner*—Bruce C. Anderson
(74) *Attorney, Agent, or Firm*—Ronald P. Kananen; Rader, Fishman & Grauer

(57) ABSTRACT

Each of the longitudinal and lateral widths of a beam size is varied by a beam size controller using a reference size (absolute dimensions) defined by a reference size defining portion as a reference. The beam size is subjected to two-dimensional variations (pseudo-variations) by combining such one-dimensional variations. Current amount measuring portion measures current amount corresponding to the two-dimensional variations of the beam size, and measured values are estimated from the current amount. An offset amount calculating portion calculates optimum values of constants of beam size correction formulae such that the offset amount from each set value is minimized or such that conformity to the size of the pattern to be transferred on the sample is achieved. The feedback of the optimum values is provided to the beam size correction formulae. Beam size correction can be carried out with high accuracy even in ultrafine regions less than 1.0 $\mu$ m, and differences between pattern dimensions attributable to longitudinal dependence can be eliminated.

17 Claims, 5 Drawing Sheets

APPARATUS AND METHOD FOR ELECTRON BEAM LITHOGRAPHY AND SEMICONDUCTOR DEVICE

BACKGROUND OF THE INVENTION

1. Field of the Invention

The present invention relates to an apparatus and a method for electron beam lithography having a beam-size-correcting function and a semiconductor device fabricated using the method for writing.

2. Description of the Related Art

Techniques of electron beam lithography are attracting attention as techniques for forming desired fine patterns on the surface of a sample such as semiconductor wafers. In the case of the formation of a large scale circuit pattern for which high throughput is needed, there is a trend toward methods for drawing a circuit pattern by dividing it into rectangles and trapezoids in different sizes (variable shaping lithography) and methods for drawing a plurality of such graphic patterns together (simultaneous shaping lithography).

There are conventional apparatuses for electron beam lithography which comprise a first aperture mask formed with a shaping window and a second aperture mask formed with a variable shape window and a simultaneous shaping lithography to perform both the variable shaping lithography and the simultaneous shaping lithography.

When the variable shaping lithography is used in such an apparatus for electron beam lithography, electron beams are applied to the entire surface of the shaping window of the first aperture mask, and an electron beam image from the shaping window is projected upon the variable shaping window of the second aperture mask in a displaced position to form an electron beam image in a different size which is used to draw a pattern of arbitrary size. When the simultaneous shaping lithography is used, electron beams are applied to the entire surface of the shaping window of the first aperture mask, and an electron beam from the shaping window is projected upon the simultaneous shaping window of the second aperture mask in a displaced position to form an electron beam image consisting of a plurality of shapes which is used to draw a desired pattern.

In such an apparatus for electron beam lithography using the variable shaping or simultaneous shaping lithography, an actual beam size can include an error from a set value caused by a displacement of the axis of the optical system for electron beams, a rotational bias of a deflector, an electrical effect of the circuit and the like, which results in a need for a technique for measuring and correcting a beam size with high accuracy.

In such apparatuses for electron beam lithography, a beam size has been measured using techniques such as a knife-edge method and has been corrected based on the result of such measurement. The knife-edge method is a technique wherein a detection mark is made of a metal such as gold having a high reflection factor in a predetermined position in the vicinity of a sample; an electron beam is scanned across an edge of the detection mark; an electron signal reflected from the detection mark is differentiated; and 50% of the strength of the resultant curve is determined as the beam size of the electron beam.

The knife-edge method described above provides a stable result in regions having relatively large dimensions such as 1.0 μm or more. However, in fine regions in which the beam size is less than 1.0 μm, using the knife-edge method, reflected electrons and current amount are smaller than those in relatively large regions of 1.0 μm or more, which results in a reduced S/N ratio and consequently results in reduced accuracy in correcting a beam size. For this reason, a beam size in such a fine region has been obtained by performing extrapolation (linear approximation) based on the result of measurement in an interpolated region (of dimensions in the range from 1.0 to 5.0 μm) wherein the beam size can be measured with stability and by making correction based on the result of the extrapolation. In fine regions where the beam size is less than 1.0 μm, however, astigmatic components (blur) occupy a relatively large part of a beam size. This results in a problem in that the use of the method based on linear approximation does not provide high accuracy because a correction error still remains.

A current density method is a method for correcting a beam size obtained by the knife-edge method. The current density method is a method wherein current amount is measured while varying each of set values of longitudinal and lateral width of a beam size in a dimensional range less than 1.0 μm on the basis of a beam size in the range from 1.0 to 5.0 μm obtained by the knife-edge method as the reference and wherein a correction table is created for each size under a condition that the beam size and current amount are proportional to each other (i.e., the current density is constant). The current amount is measured by fixing either the longitudinal or lateral width of rectangular beam patterns and by varying the other stepwise, and the one-dimensional relationship between measured values obtained from the current amount and set values is identified. Correction is made after the measurement using polygonal line correction wherein a beam size is corrected with a polygonal line such that a constant current density is achieved or wherein a beam size is shifted in certain amounts such that a constant current density is achieved.

In the case of the method to create a table of correction values in which measured values and set values are in one-dimensional relationship with each other, the measurement of a beam size and current amount in fine regions smaller than 1.0 μm is vulnerable to quantization errors in digital circuits and power supply noises on analog circuits which are directly reflected on the correction table. Therefore, the conventional method has a problem in that it cannot achieve accuracy required for a beam size correction in regions finer than 1.0 μm. In addition, conventional apparatuses for electron beam lithography have had dimensional differences between patterns caused by a phenomenon wherein actually formed beams have different lateral widths, even if the lateral width of set value is constant when the beams have different longitudinal widths (hereinafter referred to as "longitudinal dependence of a beam size".) The conventional method for correcting a beam size described above has a problem in that it can not eliminate such longitudinal dependence of a beam size.

SUMMARY OF THE INVENTION

The present invention has been made in view of the above-stated disadvantages. It is therefore an object of the present invention to provide an apparatus and a method for electron beam lithography and a semiconductor device in which correcting a beam size can be made with high accuracy even in regions finer than 1.0 μm and in which dimensional differences between patterns caused by the longitudinal dependence of a beam size can be eliminated.

An apparatus for electron beam lithography according to the present invention comprises: beam size setting means in which the longitudinal and lateral widths of electron beam having a cross section with rectangular configuration applied upon the surface of a sample can arbitrarily be set by changing the dimensions of the longitudinal and lateral widths, the beam size setting means being provided with a function for correcting the longitudinal and lateral widths of electron beam based on respective beam size correction formulae in which correction values for the longitudinal and lateral widths are finctions of two set values which are respectively set for the longitudinal and lateral widths; reference size defining means for defining a reference size; beam size control means for controlling the beam size setting means by one-dimensionally varying the longitudinal and lateral widths of the beam size on the basis of the reference size and by combining the one-dimensionally varied longitudinal and lateral widths variously to vary the beam size in a two-dimensional manner; current amount measuring means for measuring current amount each time each of the set values of the longitudinal and lateral widths of the beam size is varied; offset amount calculating means for estimating measured values for the respective set values for the longitudinal and lateral widths of the beam size from the current amount measured by the current amount measuring means and for calculating any offset amount of the measured values from each of the set values; and optimum values for constants calculating means for calculating optimum values for constants for the beam size correction formulae such that the offset amount for each of the set values calculated by the offset amount calculating means is minimized or such that the beam size conform to the pattern to be transferred to the sample and for feeding the optimum values back to the beam size correction formulae.

A method for electron beam lithography according to the present invention comprises: a first step of varying of longitudinal and lateral widths of a beam size in a one-dimensional manner using predefined reference sizes as a reference respectively, combining the longitudinal and lateral width varied in the one-dimensional manner variously to vary the beam size in a two-dimensional manner and measuring current amount each time each set values is varied; a second step of estimating a measured value corresponding to each set value from the current amount obtained in the first step; a third step of calculating an offset amount of the measured value for each set value obtained in the second step; and a fourth step of obtaining optimum values for constants of the beam size correction formulae such that the offset amount for each set value obtained in the third step is minimized or such that conformity to the size of the pattern to be transferred to the sample is achieved and providing feedback of the optimum values to the beam size correction formulae.

The term "two-dimensional" variations of beam size does not imply variations in two-dimensional directions in the strict sense of the words, but implies pseudo-variations in two dimensional directions. Specifically, by combining one-dimensional variations in each of the longitudinal and lateral widths of a beam size variously using a reference size (absolute dimensions) as a reference, it is possible to vary set values in the form of a matrix and to substantially achieve two-dimensional variations by increasing the variations of the set values. In this specification, such pseudo-variations of a beam size in two-dimensional directions is referred to as "two-dimensional" variations. Current amount corresponding to each set value is measured in accordance with such a "two-dimensional variation of a beam size". A measured value is estimated from the current amount. Any offset amount of the measured value from a set value is calculated. This makes it possible to perform substantially two-dimensional correction of the beam size, i.e., correction which takes changes in both of the longitudinal and lateral widths into account.

A semiconductor device according to the present invention fabricated using an apparatus for electron beam lithography according to the invention including a pattern draw using electron beam which have been subjected to beam size correction, and fabricated by effecting:

a first step of varying of longitudinal and lateral widths of a beam size in a one-dimensional manner using predefined reference sizes as a reference respectively, combining the longitudinal and lateral width varied in the one-dimensional manner variously to vary the beam size in a two-dimensional manner and measuring current amount each time each set values is varied;

a second step of estimating a measured value corresponding to each set value from the current amount obtained in the first step;

a third step of calculating an offset amount of the measured value for each set value obtained in the second step; and a fourth step of obtaining optimum values for constants of the beam size correction formulae such that the offset amount for each set value obtained in the third step is minimized or such that conformity to the size of the pattern to be transferred to the sample is achieved and providing feedback of the optimum values to the beam size correction formulae.

According to the apparatus and method for electron beam lithography according to the present invention, each of the longitudinal and lateral widths of a beam size is varied using a reference size (absolute dimensions) as a reference, and the beam size is subjected to two-dimensional variations by combining such one-dimensional variations. Current amount corresponding to each set value is measured in response to a two-dimensional variation of the beam size. In a fine region where the beam size is less than 1.0 $\mu$m, the relative percentage of astigmatic components (blur) of the beam size increase as described above. However, the measured current amount is not affected because the current amount includes such astigmatic components. That is, the current density is constant regardless of the beam size. It is therefore possible to estimate the measured value of the beam size from the measured current amount. Any offset amount of the measured value from each set value is calculated, and optimum values for constants of beam size correction formulae are calculated such that the offset amount from each set value is minimized or such that conformity to the size of the pattern to be transferred on the sample is achieved. The feedback of the optimum values is provided to the beam size correction formulae. A semiconductor device according to the present invention has fine patterns drawn using electron beams which have been subjected to such beam size correction.

Other and further objects, features, and advantages of the invention will appear more fully from the following description.

DETAILED DESCRIPTION OF THE PREFERRED EMBODIMENTS

A preferred embodiment of the present invention will now be described with reference to the accompanied drawings.

First embodiment

Figure 1:
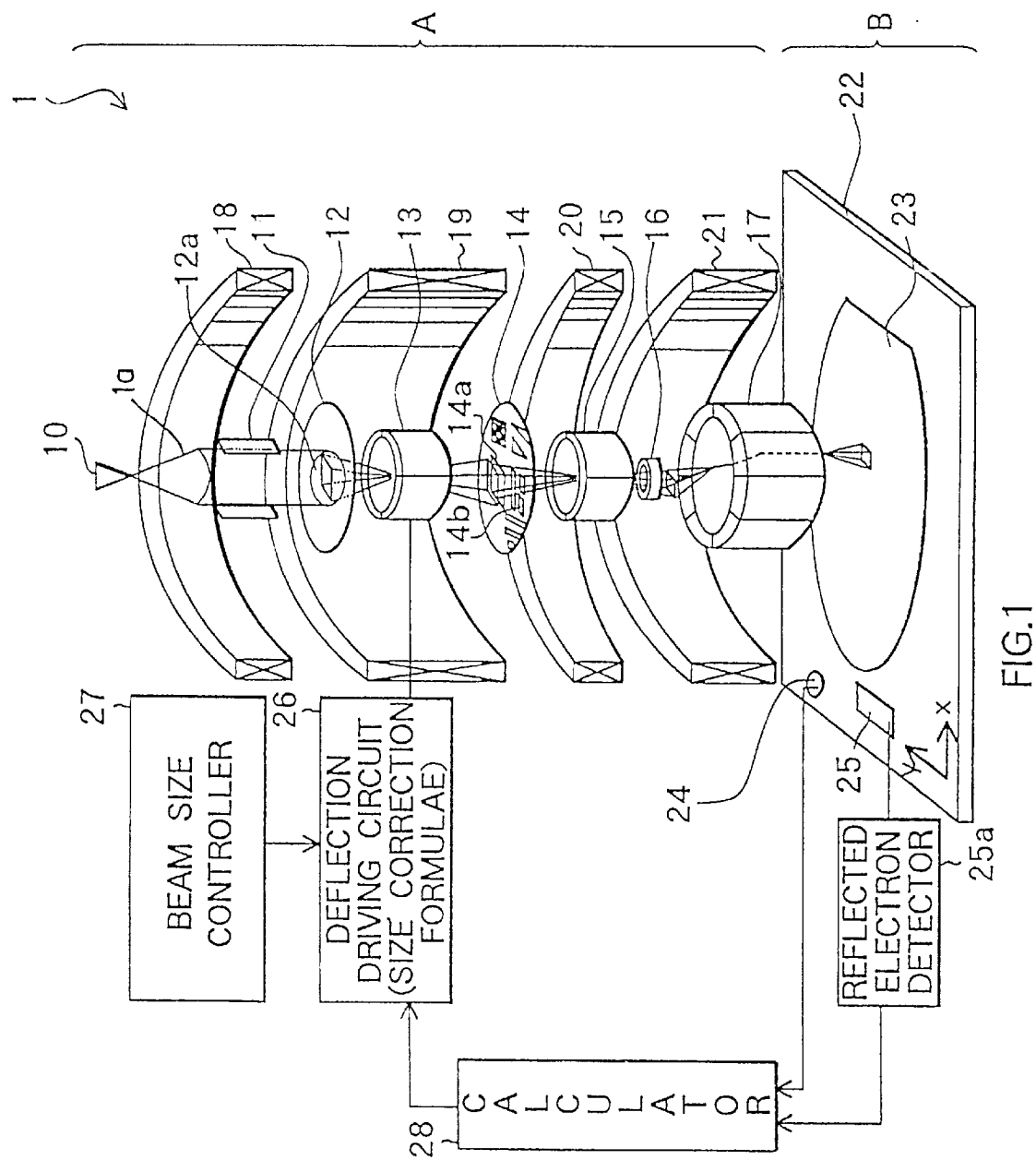
FIG. 1 shows a configuration of an apparatus for electron beam lithography according to a first embodiment of the present invention.

FIG. 1 shows a specific configuration of an apparatus 1 for electron beam lithography according to the first embodiment of the present invention. A method for electron beam lithography according to the invention is implemented as a beam size correcting operation of the apparatus 1 for electron beam lithography and, therefore, the method will be described here as a part of the operation of the apparatus 1 for electron beam lithography. The apparatus 1 for electron beam lithography performs lithography directly on samples such as semiconductor wafers, masks and the like . While the apparatus 1 for electron beam lithography has a configuration which can employ both of the variable shaping lithography and the simultaneous shaping lithography, the variable shaping lithography may be used for the present embodiment.

Figure 2:
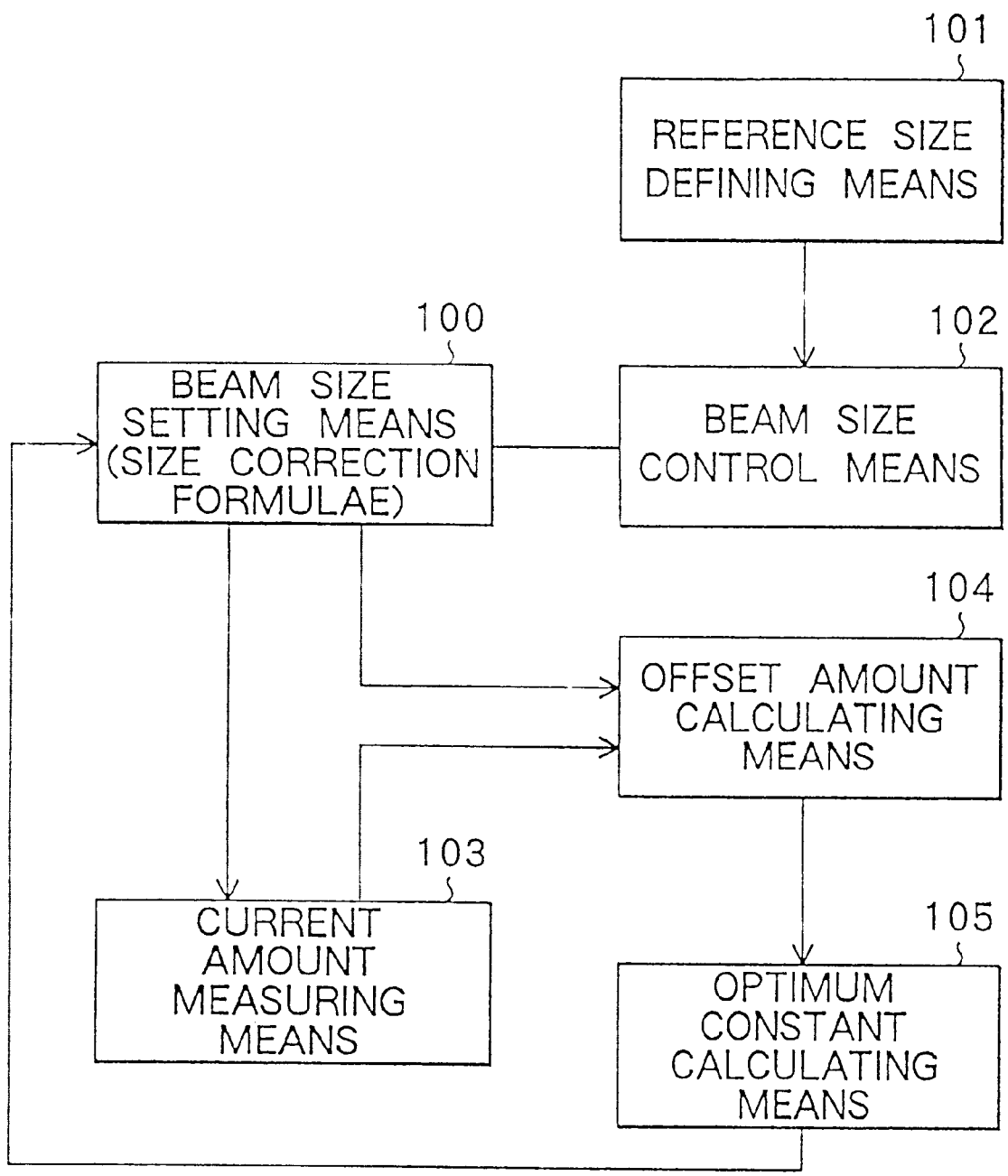
FIG. 2 is a block diagram illustrating a beam size correcting function of the apparatus for electron beam lithography shown in FIG. 1.

The apparatus 1 for electron beam lithography is generally comprised of an electron beam optical system A, a sample stage system B and a control system for providing means for each of functions shown in FIG. 2. The electron beam optical system A includes an electron beam source 10 for applying electron beams 1a to the sample stage system B. An electron gun utilizing lanthanum hexaboride (LaB$_6$) may be used as the electron beam source 10. The electron beam optical system A comprises a blanker (blanking electrode) 11 for controlling turning the application of electron beams 1a on and off along the emission path of the electron beam source 10, a first aperture mask 12 formed with a rectangular opening (shaping window 12a), a shaping deflector 13 for controlling the deflection of electron beams 1a which have passed through the first aperture mask 12, a second aperture mask 14 formed with a rectangular shaping window 14a and a simultaneous shaping window 14b which is a combination of a plurality of rectangular windows, a subdeflector 15 for controlling the deflection of electron beams 1a which have passed through the second aperture mask 14, a focus correcting lens 16 for correcting the focusing of electron beams 1a which have passed through the subdeflector 15 on the sample stage system B and a main deflector 17 for controlling the position on the sample stage system B where electron beams 1a are focused after being subjected to the focus correction by the focus correcting lens 16, those components being arranged in the order listed. In the present embodiment wherein the variable lithography is employed, only the variable shaping window 14a in the second aperture mask 14 is used. The simultaneous shaping window 14b is used in the second embodiment to be described later employing the simultaneous shaping lithography.

The shaping deflector 13 in the present embodiment deflects an electron beam image formed by the shaping window 12a of the first aperture mask 12 and projects it upon the variable shaping window 14b of the second aperture mask 14 in a displaced position to form an electron beam image in a different size with a rectangular sectional configuration. The shaping deflector 13 is driven by a deflection driving circuit 26. The deflection driving circuit 26 determines dimensions (longitudinal and lateral widths) of beams based on beam size correction formulae (1) and (2) to be described later and varies each set values for the longitudinal and lateral widths in the beam size correction formulae under the control of a beam size controller 27 as will be described later.

In the electron beam optical system A, an application lens 18 for converging electron beams 1a upon the first aperture mask 12, a shaping lens 19 for converging electron beams 1a which have passed through the first aperture mask 12 upon the second aperture mask 14, a reduction lens 20 for reducing the diameters of electron beams 1a which have passed through the second aperture mask 14 and an objective lens 21 for focusing the electron beams 1a reduced by the reduction lens 20 upon the sample stage system B are arranged around the application path of electron beams 1a in the order listed.

The sample stage system B includes an x-y stage 22 configured such that it is movable on a horizontal plane (x-y plane) by a driver which is not shown. A semiconductor wafer 23 to be a sample is placed on the x-y stage 22. For example, resist sensitive to electron beams is applied on the surface of the semiconductor wafer 23 and, in the present embodiment, a lithographic pattern is formed on the resist by electron beams 1a applied thereto by the electron beam optical system A.

Further, a Faraday cup 24 as a current amount measuring means is disposed on the x-y stage 22 in a position spaced from the semiconductor wafer 23. Electron beams 1a are also applied to the Faraday cup 24 to allow the detection of current amount based on which measured values of a beam size are detected.

The x-y stage 22 also has a detection mark 25 which is stepped from the surface of the stage. The detection mark 25 is formed from a metal such as gold (Au) which has a preferable reflection factor against electron beams. Electron beams 1a applied to the semiconductor wafer 23 are scanned across an edge of the detection mark 25 according to the knife-edge method described above, and reflected electronic signals from the detection mark 25 are detected by a reflected electron detector 25a. The reflected electronic signals detected by the reflected electron detector 25a are amplified to a predetermined level and are thereafter sent to a calculator 28. The calculator 28 carries out differentiation on the reflected electron signals detected by the reflected electron detector 25a and, for example, determines the 50% of the strength of the resultant curve as the beam size of the electron beams 1a. The beam size is in a region (e.g., a region from 1.0 to 5.0 $\mu$m) which can be accurately identified using the knife-edge method, and a beam size measured in this dimensional region becomes reference sizes which is to be described later.

Current signals detected by the Faraday cup 24 are also inputted to the calculator 28. According to the present embodiment, the calculator 28 estimates measured values from current amount corresponding to a beam size (set values) in a region finer than 0.1$\mu$ m, calculates any offset amount of the measured values from the set values and calculates optimum values for constants of beam size correction formulae (1) and (2) to be described later such that the offset amount from each of the set values is minimized or such that the beam size conform the pattern size to be transferred. The optimum values for constants obtained by the calculator 28 are reflected on the beam size correction formulae (1) and (2).

In the apparatus 1 for electron beam lithography, electron beams 1a emitted from the electron beam source 10 are applied on to the entire surface of the rectangular shaping window 12a of the first aperture mask 12 through the blanker 11. An electron beam image from. the shaping window 12a is projected by the shaping deflector 13 upon the va haping window 14a of the second aperture mask 14 in a displaced position and is formed into an electron beam image in a desired size through the subdeflector 15, focus correcting lens 16 and main deflector 17. Thus, a lithographic pattern is formed on the resist on the surface of the semiconductor wafer 23. Next, the x-y stage 22 is driven to control the position thereof and, thereafter, electron beams 1a are also scanned on the Faraday cup 24 and detection mark 25 for measuring current amount provided in the vicinity of the semiconductor wafer 23. The Faraday cup 24 measures the current amount of the electron beams 1a. The electron beams 1a in a region having relatively large dimensions of 1.0 $\mu$ m or more are applied to the detection mark 25 and reflected electron signals therefrom are detected by the reflected electron detector 25a.

A basic operation of the apparatus 1 for electron beam lithography has been described above. According to the present embodiment, electron beams 1a are subjected to highly accurate beam size correction using a method to be described later and the longitudinal dependence of the beams is eliminated. Desired fine patterns are drawn on the resist on the semiconductor wafer 23 with the electron beams 1a. The resist having the fine patterns drawn thereon is used as a mask for processing the semiconductor wafer 23, which makes it possible to fabricate a semiconductor device having patterns finer than 1.0 $\mu$m thereon. A description will be made below on control over beam size correction which is a characteristic of the present invention.

FIG. 2 illustrates a configuration of a functional block structure for beam size correction in the apparatus 1 for electron beam lithography. The apparatus 1 for electron beam lithography includes beam size setting means 100 and reference size defining means 101.

The beam size setting means 100 makes it possible to set a plurality of different dimensions as the longitudinal and lateral widths of electron beams 1a having a rectangular sectional configuration applied on to the surface of a sample (semiconductor wafer 23) and has a function of correcting each of the longitudinal and lateral widths of a beam size based on beam size correction formulae (1) and (2) which are to be described later. As will be apparent from the formulae shown below, in the beam size correction formulae, correction values W and H for the lateral and longitudinal widths are in two-dimensional correspondence with two set values $W_d$ and $H_d$ for the lateral and longitudinal widths, respectively.

$$W = a_0 + a_1 W_d + a_2 H_d + a_3 W_d H_d \quad (1)$$

$$H = b_0 + b_1 W_d + b_2 H_d + b_3 W_d H_d \quad (2)$$

($W_d$ and $H_d$ represent set values for the lateral and longitudinal widths of a beam size, respectively,; and W and H represent lateral and longitudinal widths of corrected beam size, respectively; and $a_0$, $a_1$, $a_2$, $a_3$, $b_0$, $b_1$, $b_2$ and $b_3$ represent constants.)

The reference size defining means 101 defines reference sizes in a dimensional region (e.g., a region from 1.0 to 5.0 $\mu$m) equal to or greater than a predetermined value (1.0 $\mu$m in this case). The reference sizes serve as references for calculating measured values of a beam size indirectly from current amount in a region finer than 1.0 $\mu$ m.

According to the present embodiment, a beam size in a dimensional region equal to or greater than 1.0 $\mu$m (e.g., 3.4 $\mu$m) are measured using a method such as the knife-edge method described above which allows a beam size in such a region equal to or grater than 1.0 $\mu$m to be measured accurately, and the result of such measurement is used as reference sizes. Unlike the current density method, the knife-edge method allows a beam size to be directly measured and therefore allows reference sizes to be provided as absolute dimensions. It is therefore possible to obtain current densities as the reference from the reference sizes and current amount detected by the Faraday cup 24 in association therewith and to detect measured values in a region finer than 1.0 $\mu$m accurately using the current density method.

The beam size setting means 100 is constituted by the first aperture mask 12, shaping deflector 13, second aperture mask 14, the deflection driving circuit 26 and the like shown in FIG. 1, whereas the reference size defining means 101 is constituted by the electron beam source 10, reference mark 25, reflected electron detector 25a and calculator 28.

The apparatus 1 for electron beam lithography further includes beam size control means 102 and current amount measuring means 103. The beam size control means 102 varies the longitudinal and lateral widths of a beam size in a one-dimensional manner using the reference sizes and controls the beam size setting means 101 such that the one-dimensional variations are variously combined to vary the beam size in a two-dimensional manner. The current amount measuring means 103 measures current amount each time the set value of each of the longitudinal and lateral widths of the beam size is changed. The beam size control means 102 is constituted by the beam size controller 27 shown in FIG. 1, whereas the current amount measuring means 103 is constituted by the Faraday cup 24 and calculator 28.

Figure 3:
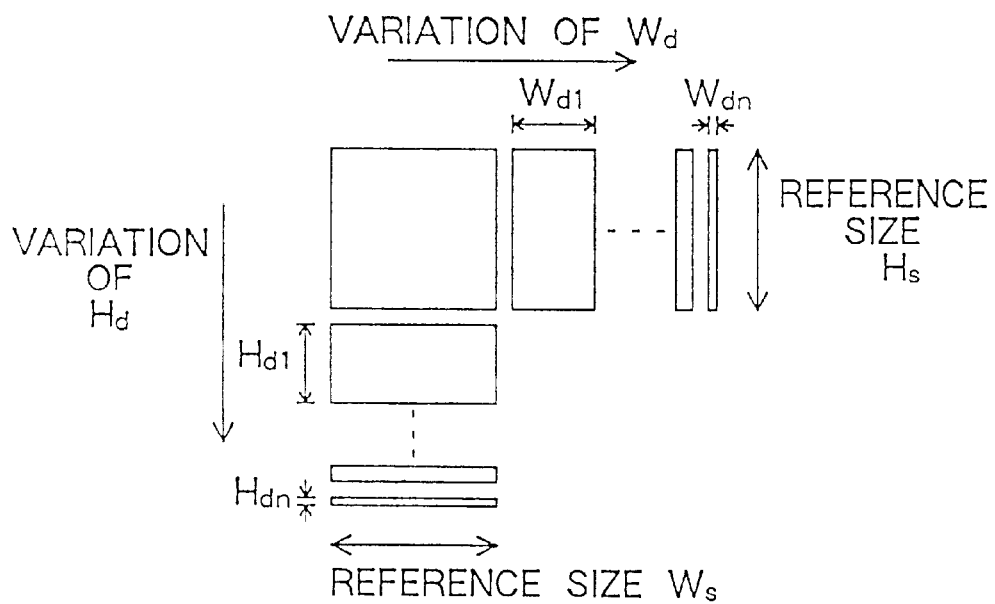
FIG. 3 illustrates a method for varying longitudinal and lateral widths of a beam size in a one-dimensional manner.
Figure 4:
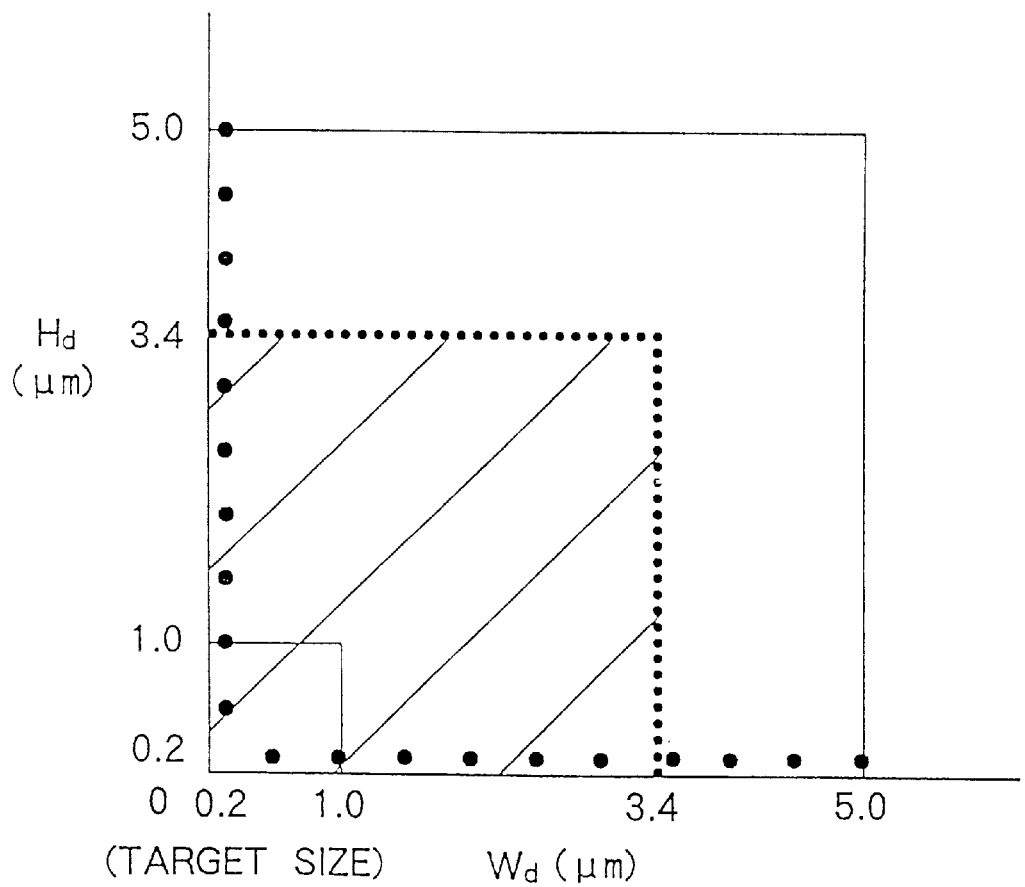
FIG. 4 illustrates a two-dimensional variation of the longitudinal and lateral widths which is a combinations of one-dimensional variations thereof.

The operation of the beam size control means 102 and current amount measuring means 103 will now be specifically described with reference to FIGS. 3 and 4. FIG. 3 illustrates one-dimensional variations of the beam size, and FIG. 4 illustrates two-dimensional variations of the beam size as combinations of the one-dimensional variations. Both of the lateral width W and longitudinal width H of the beam size can be varied in the range from 0.2 to 5.0 $\mu$m.

According to the present embodiment, as shown in FIG. 3, either the set value $H_d$ or $W_d$ for the longitudinal and lateral widths H and W of a beam size, e.g., the set value $H_d$, are fixed to a reference size $H_s$ (=3.4 $\mu$m) defined by the reference size defining means 101 and the other set value $W_d$ is varied to values in a dimensional region less than 1.0 $\mu$m (a region of 0.2 $\mu$m in this case) such as $W_{d1}, W_{d2}, \ldots, W_{dn}$. Then, measured values which are respectively corresponding to the set values $W_{d1}$ through $W_{dn}$ are calculated using the current density method to be described later. Next, the set value for $H_d$ for the longitudinal width is similarly varied to values in a dimensional region less than 1.0 $\mu$m such as $H_{d1}$, $H_{d2}, \ldots, H_{dn}$ with each set values for the lateral width fixed. Alternatively, the lateral width may be varied after varying the longitudinal width first. Further, the numbers of variations of the longitudinal and lateral widths may be different from each other.

Thus, each of the longitudinal and lateral widths of a beam size can be varied in a one-dimensional manner relative to a reference size (absolute dimensions), and the plurality of one-dimensional variations can be combined to vary the beam size in two-dimensional directions artificially. Currents corresponding to such two-dimensional variations of a beam size are measured. Measured values are estimated from the current amount to identify any offset amount of the measured values from the set values. It is therefore possible to perform substantial two-dimensional correction on a beam size in regions finer than 1.0 μm where such correction has not been possible to be made according to conventional methods. Specifically, both of the longitudinal and lateral widths can be corrected taking variations of each other into account. This improves the accuracy of size correction and eliminates the longitudinal dependence of a beam size.

FIG. 4 shows a state in which both of the longitudinal and lateral widths of a beam size are varied only in a target dimensional region (0.2 μm) as indicated by the black dots. The number of such regions may be increased to perform highly accurate size correction in wider range.

The apparatus 1 for electron the beam lithography further includes offset amount calculating means 104 and optimum constant calculating means 105. The offset amount calculating means 104 estimates a measured value corresponding to each set value from current amount measured by the current amount measuring means 103 and calculates any offset amount between the measured and set values for each of the set values.

The optimum constant calculating means 105 calculates optimum values for the constants ($a_0$ through $a_3$ and $b_0$ through $b_3$) of the beam size correction formulae (1) and (2) at the beam size setting means 101 such that the offset amount for each set value calculated by the offset amount calculating means 104 is minimized, and feeds the optimum values back to the beam size correction formulae (1) and (2) set in the deflection driving circuit 26. Specifically, the least square method is used in which the offset amount of the respective set values serve as functions of the set values, and resultant coefficients are added to respective constants ($a_0$ through $a_3$ and $b_0$ through $b_3$) of the beam size correction formulae to perform correction. Since correction values W and H for the longitudinal and lateral widths are in two-dimensional correspondence with the set values $W_d$ and $H_d$ of the longitudinal and lateral widths in the beam size correction formulae (1) and (2), two-dimensional correction can be substantially carried out with high accuracy by setting optimum values for the constants and repeating such a step.

The method of parameter-fitting to obtain the constants is not limited to the minimization of the calculated offset amount, and there is an alternative method wherein desirable states of the correction formulae are stored in advance and such states are pursued to achieve conformance to the size of a pattern to be transferred, i.e., to accommodate errors during resist development and the like may be stored in advance.

The offset amount calculating means 104 and optimum constant calculating means 105 are constituted by the calculator 28 shown in FIG. 1, respectively.

Figure 5:
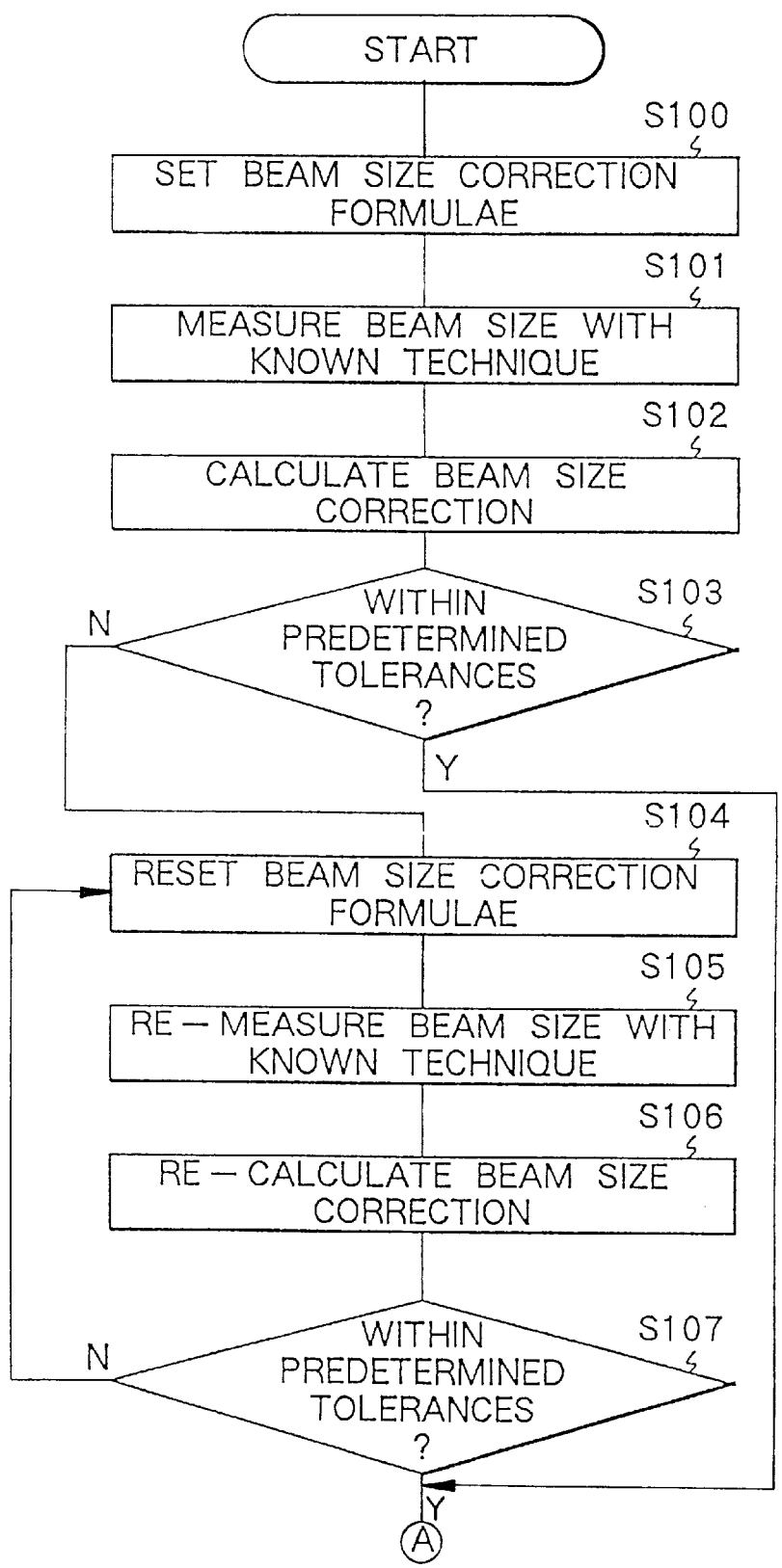
FIG. 5 is a flow chart illustrating a beam size correcting operation of the apparatus for electron beam lithography shown in FIG. 1.
Figure 6:
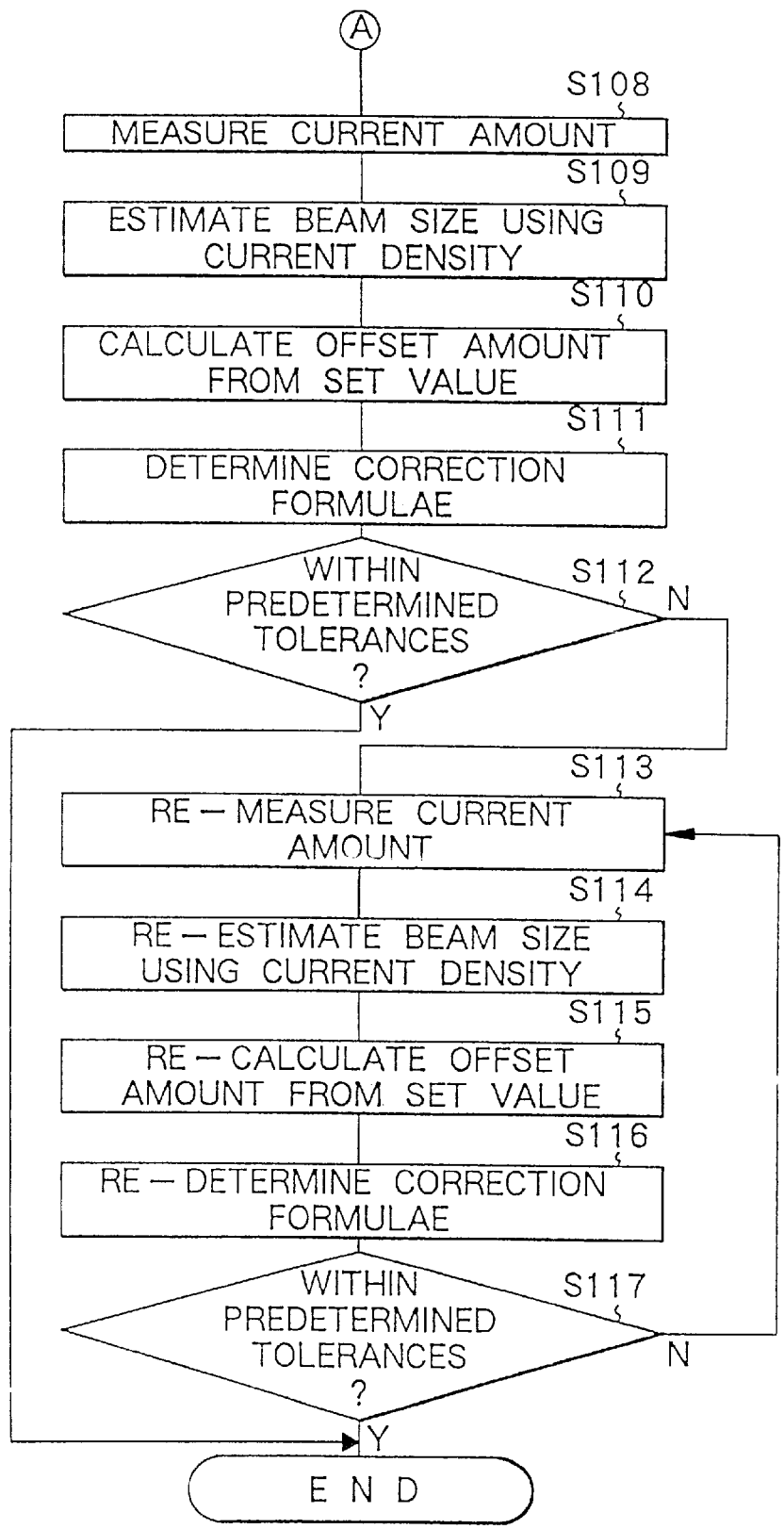
FIG. 6 is a flow chart illustrating a beam size correcting operation of the apparatus for electron beam lithography shown in FIG. 1.

A description will now be made with reference to the flow chart shown in FIGS. 5 and 6 on an operation of the apparatus 1 for electron beam lithography to control beam size correction. Beam size correction according to the present embodiment comprises a first correction stage (steps S100 through S107) for relatively large dimensional region (1.0 to 5.0 μm) using a well-known method and a second correction stage (steps S108 through S117) wherein two-dimensional correction is performed using current densities.

At the first correction stage, the beam size correction formulae (1) and (2) are set with predetermined constants (step S100), and a well-known method such as the knife-edge method is performed to obtain measured values of a beam size in a dimensional region equal to or greater than a predetermined value (step S101). Next, offset amount corresponding to the measured values are calculated; calculations are made to correct the beam size depending on the offset amount (step S102); if the differences between the set values and measured values are within predetermined tolerances (step S103; Y), the process proceeds to the next step (step 108 in FIG. 6). If the differences between the measured and set values are equal to or greater than the predetermined tolerances (step S103; N), the constants of the beam size correction formulae (1) and (2) are reset, and the above-described steps are repeated (steps S104 through S107). When the differences between the measured and set values come in the predetermined tolerances (step S107; YES), the first correction stage is terminated, and the process proceeds to step S108. The dimensions obtained by the knife-edge method at this stage are used as the reference size.

At the second correction stage, the longitudinal and lateral widths of a beam size are varied in a one-dimensional manner using the reference size obtained at the first correction stage as a reference, and resultant one-dimensional variations are combined variously to vary the longitudinal and lateral widths of the beam size in a two-dimensional manner. Each time, each set value of the longitudinal and lateral widths is varied, current amount is measured (step S108). Next, measured values corresponding to the set values are estimated from resultant current amount (step S109), and offset amount of the measured values from the set values are calculated (step S110). Then, optimum values for the constants ($a_0$ through $a_3$ and $b_0$ through $b_3$) of the beam size correction formulae (1) and (2) are obtained such that the offset amount for the respective set values are minimized and the beam size conforms to the size of the pattern to be transferred, and the optimum values are reflected on the beam size correction formulae (1) and (2) to determine the correction formulae (step S111). Subsequently, it is determined whether the differences between the measured and set values resulting from correction carried out using the new beam size correction formulae are within predetermined tolerances or not (step S112). If they are within the predetermined tolerances (step S112; Y), the second correction stage is terminated. If the differences are equal to or greater than the predetermined tolerances (step S112; N), the current amount for each size is re-measured and the above-described steps are repeated (step S113 through S117). When the differences between the measured and set values come in the predetermined tolerances (step S117; Y), the second correction stage is terminated.

As described above, according to the present embodiment, an apparatus for electron beam lithography of the variable shaping lithography type carries out correction of a beam size in a relatively large dimensional region using a well-known method such as the knife-edge method at a first correction stage and performs a two-dimensional correction using the current density method in a second correction stage that follows defining of a reference size in such a region. This makes it possible to perform beam size correction with high accuracy in a region of fine dimensions less than 1.0 μm, which has been impossible with the prior methods.

Further, since the present embodiment substantially allows a two-dimensional correction, it is possible to eliminate the longitudinal dependence of a beam size which has caused dimensional differences between patterns in prior methods of correction.

While a first embodiment of the present invention has been described above, other embodiments of the invention will be described below.

Second embodiment

The first embodiment has referred to an apparatus for electron beam lithography of the variable shaping lithography type that utilizes the variable shaping window 14a of the second aperture mask 14, whereas lithography is performed on the simultaneous shaping lithography using the simultaneous shaping window 14b according to the present embodiment. The present embodiment has the same basic configuration as that of the first embodiment (FIGS. 1 and 2). Therefore, the following description will refer only to parts which are different from the first embodiment.

The present embodiment is different from the first embodiment in the configurations of the beam size setting means 100 and reference size defining means 101. The beam size setting means 100 comprises a first aperture mask 12 having a shaping window, a second aperture mask 14 having a simultaneous shaping window 14b corresponding to the shaping window 12a of the first aperture mask 12, a shaping deflector 13 for deflecting an electron beam image from the shaping window 12a of the first aperture mask 12 and for projecting it upon the simultaneous shaping window 14b of the second aperture mask 14 in a displaced position to form an electron beam image formed by a plurality of graphic patterns having a rectangular sectional configuration and a deflection driving circuit 26 for driving the shaping deflector 13 based on predetermined beam size correction formulae (1) and (2).

The reference size defining means 101 in the present embodiment provides a reference size which is a size (absolute dimensions) defined by the simultaneous shaping window 14b of the second aperture mask 14. Specifically, the size of the simultaneous shaping window 14b can be measured accurately in advance with an SEM (scanning electron microscope) or the like and is used as the reference size instead of a measured value obtained by the knife-edge method in the first embodiment. The configuration is otherwise similar to that of the first embodiment.

According to the present embodiment, a measured value corresponding to each of set values is obtained using the reference size defined by the simultaneous shaping window 14b, and constants of the beam size correction formulae (1) and (2) are refined using a parameter fitting process such that any offset amount of each measured value from the set value is minimized or such that the beam size conforms to the size of the pattern to be transferred. This method of correction based on the current density method will not be described here because it is the same as that in the first embodiment.

Like the first embodiment, the present embodiment makes it possible to correct the sizes of beams in regions finer than 1.0 μm with high accuracy, which has been impossible with prior methods, and to eliminate longitudinal dependence of a beam size.

Third embodiment

A beam size is varied in a two-dimensional manner in a wide range including a target beam size(e.g., 0.2 μm) according to the first and second embodiments. According to the present embodiment, the beam size setting means 100 is controlled to cause two-dimensional variations only in the vicinity of a target beam size as indicated by the black dots in FIG. 4; measured values are obtained from current amount corresponding to the variations; and offset amount of the measured values from set values are identified.

Since correction is thus carried out based on the offset amount of the measured values from the set values only in the vicinity of a target beam size within a range in which the beam size can be varied, the beam size correction can be carried out at a high speed without sacrificing the accuracy of the correction of the target size. The configuration, operation and effects of the present embodiment are otherwise the same as those of the first embodiment.

A fourth embodiment of the present invention will now be described.

Fourth Embodiment

According to the present embodiment, when a beam size is varied in a two-dimensional manner by the beam size control means 102 shown in FIG. 2, the variations are weighted in regions close to a target beam size. For example, if the target beam size is 0.2 μm, the beam size is varied every 0.2 μm in regions close to 5.0 μm or 3.0 μm, every 0.1 μm in region equal to or finer than 0.1 μm and every 0.05 μm in regions equal to or finer than 0.4 μ m. Thereafter, current amount corresponding to each size is measured and any offset amount of the measured value form a set value is identified as in the first embodiment. Since correction is performed based on such a weighted offset amount, the accuracy of correction of a target size is improved and a beam size can be corrected at a high speed without sacrificing the accuracy of correction of a target size. The configuration, operation and effects of the present embodiment are otherwise the same as those of the first embodiment.

Fifth embodiment

According to the present embodiment, the offset amount calculating means 105 shown in FIG. 2 calculates offset amount of measured values from set values with weighting in regions close to a target beam size. For example, if the target beam size is 0.2 μm, offset amount of measured values from set values are weighted using, for example, a weighting coefficient 1 for offset amount in regions close to 5.0 μm or 3.0 μm, a weighting coefficient of 2 for regions equal to or finer than 1.0 μm and a weighting coefficient of 4 for regions equal to or finer than 0.4 μm. Since the constants of the correction of a beam size formulae are obtained based on the result of calculations reflecting such weighting, the accuracy of correction of a target size is improved, a beam size can be corrected at a high speed without sacrificing the accuracy of correction of a target size.

While the present invention has been described with reference to specific embodiments thereof, the present invention is not limited to the above-described embodiments and it is possible to modify the embodiments. For example, an apparatus for electron beam lithography to which the invention is applied is not limited to the configuration shown in FIG. 1 and may have other configurations. Although a reference size is determined using the knife-edge method in the first embodiment, other method may be employed as long as they allow the measurement of absolute dimensions. Further, while a beam size is at a predetermined size of 1.0 μm and a reference size is defined in a range equal to or greater than the predetermined value (1.0 to 5.0 μm) in the above-described embodiments, any range may be used as long as absolute values can be accurately measured. Therefore, the predetermined value is not limited to 1.0 μm.

As described above, according to an apparatus and method for electron beam lithography according to the present invention, the longitudinal and lateral widths of a beam size are varied in a one-dimensional manner; and the one-dimensional variations are variously combined to vary the beam size in a two-dimensional manner, thereby substantially performing two-dimensional correction. This makes it possible to perform correction of a beam size with high accuracy even in regions of dimensions less than a predetermined value, to eliminate longitudinal dependence of a beam size and to prevent the occurrence of differences between the dimensions of patterns.

Especially, according to the apparatus and method for electron beam lithography according to the present invention, a beam size is varied in regions close to a target beam size, and correction is carried out. This makes it possible to improve the accuracy of correction of a target size and to perform correction of a beam size at a high speed without sacrificing the accuracy of correction of a target size in addition to the effects described above.

Further, according to the apparatus and method for electron beam lithography according to the present invention, offset amount between measured values and set values are calculated with weighting in regions close to a target beam size. As a result, it is possible to improve the accuracy of correction of a target size and to perform a correction of a beam size at a high speed without sacrificing the accuracy of correction of a target size in addition to the above-described effects.

Furthermore, a semiconductor device according to the present invention is fabricated using an apparatus and method for electron beam lithography according to the present invention. Therefore, the device will have fine patterns whose sizes are to be corrected with high accuracy, which allows a higher level of integration.

Obviously many modifications and variations of the present invention are possible in the light of the above teachings. It is therefore to be understood that within the scope of the appended claims the invention may be practiced otherwise than as specifically described.

What is claimed is:

1. An apparatus for electron beam lithography comprises:
   beam size setting means in which the longitudinal and lateral widths of electron beam having rectangular sectional configuration applied upon the surface of a sample are arbitrarily set by changing the dimension of the longitudinal and-lateral widths, the beam size setting means being provided with a function for correcting the longitudinal and lateral widths of electron beam based on respective correction of a beam size formulae in which correction values of the longitudinal and lateral widths are functions of two set values which are respectively set for the longitudinal and lateral widths;
   reference size defining means for defining a reference size;
   beam size control means for controlling the beam size setting means by one-dimensionally varying the longitudinal and lateral widths of the beam size on the basis of a reference size and by combining the one-dimensionally varied longitudinal and lateral widths variously to vary the beam size in a two-dimensional manner;
   current amount measuring means for measuring current amount each time each set value of the longitudinal and lateral widths of the beam size is varied;
   offset amount calculating means for estimating measured values for the respective set values for the longitudinal and lateral widths of the beam size from the current amount measured by the current amount measuring means and for calculating the offset amount of the measured values from each set value; and
   optimum values for constants calculating means for calculating optimum values for the beam size correction formulae such that the offset amount for each set value calculated by the offset amount calculating means is minimized or such that the beam size conforms to the pattern to be transferred to the sample and for feeding the optimum values back to the beam size correction formulae.

2. An apparatus for electron beam lithography according to claim 1, wherein the beam size control means controls such that while one of the set values for the longitudinal and lateral widths of the beam size is being fixed to the reference size, the other set values is varied, and one of the set values is varied for each of measured values corresponding to respective set values of the other, while the respective measured values are being fixed.

3. An apparatus for electron beam lithography according to claim 1, wherein the beam size setting means comprises:
   a first aperture mask having a shaping window on to which electron beam from the means for emitting the electron beam is applied;
   a second aperture mask having a variable shaping window corresponding to the first aperture mask;
   a shaping deflector for deflecting an electron beam image from the shaping window of the first aperture mask to project the electron beam image upon the variable shaping window of the second aperture mask in a displaced position, thereby forming an electron beam image having a rectangular sectional configuration; and
   a deflection driving circuit for driving the shaping deflector based on the beam size correction formulae.

4. An apparatus for electron beam lithography according to claim 3, wherein the reference size defining means measures the absolute dimension of the electron beam in a dimensional region equal to or greater than a predetermined value to define the result of the measurement as the reference size.

5. An apparatus for electron beam lithography according to claim 6, wherein the absolute dimension serving as the reference size is measured by the knife-edge method.

6. An apparatus for electron beam lithography according to claim 1, wherein the beam size setting means comprises:
   a first aperture mask having a shaping window on to which electron beam from a means for emitting the electron beam is applied;
   a second aperture mask having a simultaneous shaping window corresponding to the first aperture mask;
   a shaping deflector for deflecting an electron beam image obtained from the shaping window of the first aperture mask to project the electron beam image upon the simultaneous shaping window of the second aperture mask in a displaced position, thereby forming an electron beam image including a plurality of graphic patterns having a cross section with rectangular configuration; and
   a deflection driving circuit for driving the shaping deflector based on the beam size correction formulae.

7. An apparatus for electron beam lithography according to claim 4, wherein the reference size defining means defines the absolute dimension defined by the simultaneous shaping window of the second aperture mask as the reference size.

8. An apparatus for electron beam lithography according to claim 1, wherein beam size correction is carried out by varying the beam size in a two-dimensional manner at least in a dimensional region less than a predetermined value.

9. An apparatus for electron beam lithography according to claim 1, wherein the beam size control means controls the beam size defining means such that the set values are varied only in a region close to a target beam size.

10. An apparatus for electron beam lithography according to claim 1, wherein the beam size control means varies the set values while assigning weights to a region close to a target beam size when the set values are varied.

11. An apparatus for electron beam lithography according to claim 1, wherein the offset amount calculating means calculates offset amount of each of the measured values from each set value while performing weighting in a region close to a target beam size.

12. An apparatus for electron beam lithography according to claim 1, wherein the correction of a beam size formulae are:

$$W = a_0 + a_1 W_d + a_2 H_d + a_3 W_d H_d$$

$$H = b_0 + b_1 W_d + b_2 H_d + b_3 W_d H_d$$

where $W_d$ and $H_d$ represent the set values for the lateral and longitudinal widths of a beam size, respectively, and W and H represent lateral and longitudinal widths of corrected beam size, respectively and $a_0$, $a_1$, $a_2$, $a_3$, $b_0$, $b_1$, $b_2$ and $b_3$ represent constants and wherein the optimum values for constants calculating means calculates the optimum values of constants ($a_0$ through $a_3$ and $b_0$ through $b_3$) of the beam size correction formulae from the offset amount from each set value calculated by the offset amount calculating means.

13. A method for electron beam lithography wherein electron beam is applied to a shaping window of a first aperture mask; an electron beam image from the shaping window is deflected and controlled by a shaping deflector having a function for effecting correction based on beam size correction formulae in which correction values for longitudinal and lateral widths are functions of two set values of the longitudinal and lateral widths to project the electron image upon a variable shaping window or a simultaneous shaping window of a second aperture mask in a displaced position, thereby forming an electron beam image in a different size and drawing a pattern in an arbitrary size on a sample by the electron beam image thus formed, the method comprising:

a first step of varying the longitudinal and lateral widths of a beam size in a one-dimensional manner using a predefined reference size as a reference respectively, combining the longitudinal and lateral widths varied in the one-dimensional manner variously to vary the beam size in a two-dimensional manner and measuring current amount each time each set value is varied;

a second step of estimating a measured value corresponding to each set value from the current amount obtained in the first step;

a third step of calculating an offset amount of the measured value for each set value obtained in the second step from the set value; and a fourth step of obtaining optimum values of the constants of the beam size correction formulae such that the offset amount of each set value obtained in the third step is minimized or such that conformity to the size of the pattern to be transferred to the sample is achieved and providing feedback of the optimum values to the beam size correction formulae.

14. A method for electron beam lithography according to claim 13, wherein the set value is varied only in a region close to a target beam size.

15. A method for electron beam lithography according to claim 13, wherein the set value is varied with assigning weights to a region close to a target beam size in the first step.

16. A method for electron beam lithography according to claim 13, wherein the offset amount of the measured value against the set value is calculated with assigning weights to a region close to a target beam size in the third step.

17. A semiconductor device fabricated using an apparatus for electron beam lithography wherein electron beams are applied to a shaping window of a first aperture mask, an electron beam image from the shaping window is deflected and controlled by a shaping deflector having a function for effecting correction based on beam size correction formulae in which correction values for longitudinal and lateral widths are functions of two set values for the longitudinal and lateral widths to project the electron beam image upon a variable shaping window or a simultaneous shaping window of a second aperture mask in a displaced position, thereby forming an electron beam image in a different size and drawing a pattern in an arbitrary size on a sample by using the electron beam image thus formed;

a first step of varying the longitudinal and lateral widths of a beam size in a one-dimensional manner using a predefined reference size as the reference respectively, combining the longitudinal and lateral widths in the one-dimensional variations variously to vary the beam size in a two-dimensional manner and measuring current amount each time each set value is varied;

a second step of estimating a measured value corresponding to each set value from the current amount obtained in the first step;

a third step of calculating an offset amount of the measured value for each set value obtained in the second step from the set value; and a fourth step of obtaining optimum values of the constants of the beam size correction formulae such that the offset amount for each set value obtained in the third step is minimized or such that conformity to the size of the pattern to be transferred to the sample is achieved and providing feedback of the optimum values to the beam size correction formulae.

* * * * *